United States Patent [19]
Dobkin

[11] 3,790,817
[45] Feb. 5, 1974

[54] SCHOTTKY CLAMPED TTL CIRCUIT

[75] Inventor: Robert C. Dobkin, Menlo Park, Calif.

[73] Assignee: National Semiconductor Corporation, Santa Clara, Calif.

[22] Filed: Feb. 14, 1972

[21] Appl. No.: 225,742

[52] U.S. Cl. .................. 307/214, 307/215, 307/218, 307/237, 307/299 R
[51] Int. Cl. ...................... H03k 19/40, H03k 19/08
[58] Field of Search .... 307/214, 215, 218, 237, 299

[56] References Cited
OTHER PUBLICATIONS

L. P. Hunter, Handbook of Semiconductor Electronics, 3rd Edition, Copyright 1970, McGraw-Hill Book Company, pp. 10–11 to 10–14.

*Primary Examiner*—John Zazworsky

[57] ABSTRACT

A low power TTL gating circuit wherein PNP transistors have been used in place of the usual current source resistors and Schottky-clamped NPN have been used in place of the usual gold doped NPN gating elements to obtain a faster operating circuit which requires less chip area than similar prior art circuits.

10 Claims, 2 Drawing Figures

SCHOTTKY CLAMPED TTL CIRCUIT

SUMMARY OF THE INVENTION

The present invention relates generally to integrated circuit logic devices and more particularly to a low power TTL gating circuit using PNP transistor current sources in combination with Schottky-clamped NPN transistors.

Briefly, the present invention includes a pair of PNP transistors which are used as passive current sources for supplying drive current for a plurality of Schottky-clamped NPN transistor devices. The Schotty-clamped circuit elements each include a conventional NPN transistor device having a Schotty diode provided in parallel with its base-collector junction. The use of the Schottky-clamped configuration prevents the transistors from reaching saturation, and thus increases the operational speed of the circuit. The substitution of the PNP transistors for the prior art, large resistances effects a substantial saving in required chip area as well as contributing to increase operational speed due to a reduction of the circuits RC time constants.

These and other advantages of the present invention will no doubt become apparent to those of ordinary skill in the art after having read the following detailed description of the preferred embodiment which is illustrated in the drawing.

In The Drawing

DETAILED DESCRIPTION OF THE PREFERRED EMBODIMENT

Figure 1:
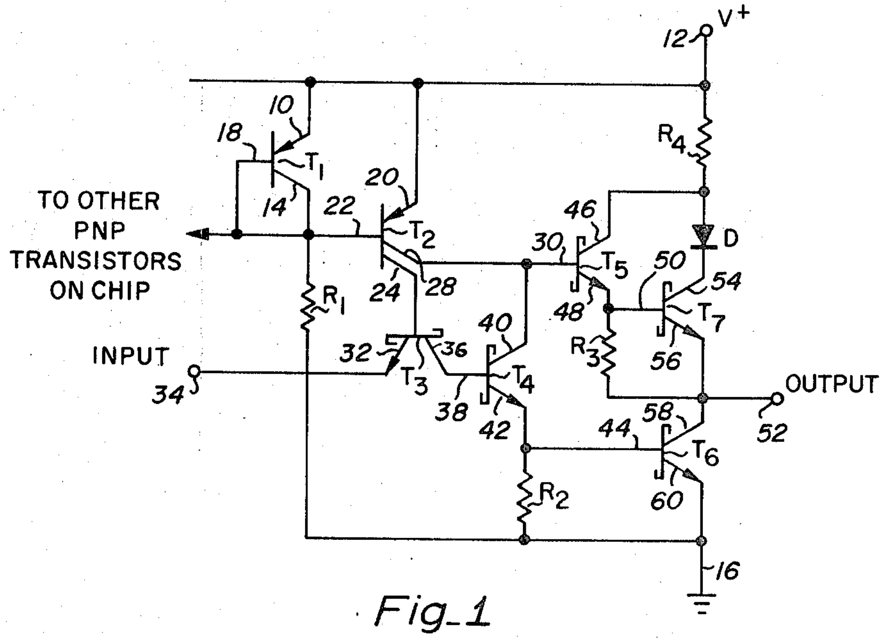
FIG. 1 is a schematic diagram of a Schottky-clamped low power TTL circuit in accordance with the present invention.

Referring now to FIG. 1 of the drawing, a presently preferred embodiment of an IC logic circuit in accordance with the present invention is shown in simplified schematic diagram form. The circuit includes a pair of lateral PNP transistors $T_1$ and $T_2$, five Schottky clamped NPN transitors $T_3$-$T_7$, four resistors $R_1$, $R_2$, $R_3$ and $R_4$, and a diode D.

Figure 2:
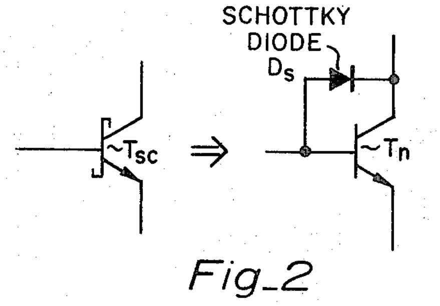
FIG. 2 is a schematic diagram illustrating the Schottky-clamped transistor structure shown schematically in FIG. 1.

Transistor-Transistor-Logic (TTL) normally uses resistors to provide current to the active transistors and in order to obtain circuits having low saturation time, gold is normally used in the processing steps of the transistor elements. This makes it impossible to construct useable PNP transistors on the same IC chip. For low power TTL circuits in particular, the resistive values of the current source resistors are very large and occupy a large amount of chip area. If however, the active transistors on the chip are clamped with Schottky diodes (to form Schottky-clamped transistors 2, as illustrated in FIG. 2), it is no longer necessary to process the devices with gold. This allows gold lateral PNP transistors to be constructed on the chip for use as current sources replacing the majority of the large valued resistors in the circuit. This, of course, means that substantially smaller chip area is required for the simple TTL circuit.

As shown in FIG. 2, a Schottky-clamped transistor $T_{sc}$ includes a normal bipolar transistor element $T_n$ in combination with a Schottky diode (Schottky PN junction) $D_s$. The Schottky diode is provided in parallel with the base-collector junction of transistor $T_n$ to prevent transistor $T_n$ from being biased into saturation. The Schottky diode $D_s$ has the characteristic that it conducts at a potential lower than that of the base-collector junction of transistor $T_n$ and therefore prevents the base-collector junction from ever being forward biased. Since transistor $T_n$ is prevented from saturating, the Schottky-clamped combination can turn off faster than the normal transistor alone, and its operation will more closely follow the drive potential applied to its base.

Referring again to FIG. 1, the emitter 10 of PNP transistor $T_1$ is coupled to a potential supply $V^+$ at terminal 12 while its collector 14 is coupled through the resistor $R_1$ to circuit ground (substrate) at 16. The base 18 of transistor $T_1$ is shorted to collector 14. The emitter 20 of the multiple collector PNP transistor $T_2$ is connected to $V\pm$ at terminal 12, its base 22 is coupled to collector 14 of transistor $T_1$, and one of its collectors 24 is coupled to the base 26 of the Schottky transistor $T_3$ while the other collector 28 is coupled to the collector 40 of the Schottky-clamped transistor $T_4$ and to the base 30 of the Schottky-clamped transistor $T_5$.

The emitter 32 of transistor $T_3$ is coupled to a circuit input terminal 34 while its collector 36 is coupled to the base 38 of transistor $T_4$. The collector 40 of transistor $T_4$ is connected to base 30 of the Schottky-clamped transistor $T_6$ and the emitter 42 is connected through resistor $R_2$ to circuit ground.

The Schottky-clamped transistors $T_5$ and $T_7$ form a Darlington circuit in which the collector 46 of transistor $T_5$ is coupled through resistor $R_4$ to $V^+$ at terminal 12, and its emitter 48 is coupled to the base 50 of transistor $T_7$ and through resistor $R_3$ to the output terminal 52.

The collector 54 of transistor $T_7$ is coupled to the cathode of the diode D. The anode of diode D is coupled to collector 46 of transistor $T_5$ and to the lower side of resistor $R_4$. The emitter 56 of transistor $T_7$ is coupled to output terminal 52. The collector 58 of transistor $T_6$ is coupled to output terminal 52 and its emitter 60 is coupled to circuit ground at 16.

It will be noted that this circuit resembles the standard TTL low power gating circuit with the exception that lateral PNP transistors $T_1$ and $T_2$ are used as current sources in place of the physically large resistive elements which have heretofore been used. For example, the resistive equivalents of transistors $T_1$ and $T_2$ in a similar prior art circuit would have resistive values of 40kΩ and 20kΩ respectively, and would require at least twice as much chip area as is required to accommodate the illustrated circuit.

Resistor $R_1$ and transistor $T_1$ may be used to provide bias for any additional PNP devices provided on the chip along with the illustrated circuit. This means that only one biasing network need be used even for a relatively complex integrated circuit, thus effecting additional savings of chip area in multiple gate chips.

In operation, transistor $T_1$ serves as a current source for supplying base drive for transistor $T_2$ which, in turn, provides base drive for transistors $T_3$ and $T_5$, as well as collector current for transistor $T_4$. The geometry of collectors 24 and 28 of course determines the amount of current supplied to the various transistors. When conductive, transistor $T_5$ supplies base drive for transistor $T_7$ and transistor $T_4$ provides base drive for transistor $T_6$. Transistor $T_7$ forms a switching means for pulling output terminal 52 toward $V^+$. Simiarly, transistor $T_6$ forms a switching means for pulling output terminal 52 to circuit ground.

With a "high" input signal applied to input terminal 34 (a potential of more than approximately 1 volt above ground), transistor $T_3$ is biased non-conductive. Thus, current flowing into the base 38 of transistor $T_4$ through The Schottky diode associated with transistor $T_3$ (see FIG. 2) causes transistor $T_4$ to conduct. As transistor $T_4$ turns conductive, it provides base drive for transistor $T_6$ causing it to become conductive to pull output terminal 52 to ground. As this occurs, the base 30 of transistor $T_5$ is pulled down to a low potential of approximately one $V_{CEsat}$ (transistor $T_4$) plus one diode drop (the base-emitter junction of transistor $T_6$). This low potential is insufficient to cause the Darlington circuit to conduct and accordingly, transistor $T_7$ will be in its non-conductive state thereby isolating output terminal 52 from $V^+$.

However, when input terminal 34 is pulled to "low" (to circuit ground), transistor $T_3$ becomes conductive turning transistor $T_4$ off and in turn turning transistor $T_6$ off to isolate output terminal 52 from circuit ground by the off-impedance of transistor $T_6$. With transistor $T_4$ non-conductive, the entire collector current supplied by collector 28 of transistor $T_2$ is provided to the base 30 of transistor $T_5$ to turn it on and in turn, turn transistor $T_7$ on to pull output terminal 52 toward $V^+$.

Although the illustrated circuit is shown in simplified form, much more complex circuits can, of course be provided to accomplish more complicated logical operations than those of the sample gate shown without departing from the merits of the present invention. Accordingly, it should be understood that the principle objective of the invention is to provide a smaller, faster operating circuit by combining PNP transistor current sources with Schottky-clamped NPN transistors. The illustrated logic circuit can be made as fast or faster than currently produced TTL low power logic circuit while at the same time saving chip area.

The present invention has been described above in terms of a particular circuit embodiment including PNP transistors used as current sources and NPN transistors used as the Schottky-clamped elements; however, it will be appreciated that alternatively NPN transistors could be used for the current source elements where PNP transistors are used for the Schottky-clamped elements. Alternatively, standard TTL logic, if Schottky-clamped, could be made with PNP current source loads, however, the advantage of the current source load would not be as great because the resistor sizes used in standard logic are much smaller.

Although the present invention has been disclosed in terms of a single preferred embodiment, it will be appreciated that other similar circuit arrangements could also be provided without departing from the invention. Accordingly, it is intended that the appended claims be interpreted as covering all such circuit arrangements and other modifications which fall within the true spirit and scope of the invention.

What is claimed is:

1. A TTL circuit comprising:

a plurality of Schottky-clamped transistor elements of a first conductivity forming a gating circuit having a circuit output terminal and responsive to an input signal and operative to couple the circuit output terminal to a first source of potential when said input signal is of a first signal state and to couple the circuit output terminal to a second source of potential when said input signal is of a second switching state; and current source means for supplying drive current to said gating circuit, said current source means including at least one transistor of a second conductivity type.

2. A logic gating circuit comprising:

a first transistor of a first conductivity type having a first emitter for receiving input gating signals, a first base, and a first collector;

a first Schottky diode coupled between said first base and said first collector;

a second transistor of said first conductivity type having a second base coupled to said first collector, a second collector for developing a first switching signal and a second emitter for developing a second switching signal;

a second Schottky diode coupling said second base to said second collector;

current source means including a third transistor of a second conductivity type for supplying base drive current to said first transistor and collector current to said second transistor;

a first switching means responsive to said first switching signal and operative to develop an output signal of a first logic state; and a second switching means responsive to said second switching signal and operative to develop an output signal of a second logic state.

3. A logic gating circuit as recited in claim 2 wherein said third transistor is a lateral transistor having a third base, a third emitter, and a pair of collectors, one being coupled to said second collector, and the other being coupled to said first base

4. A logic gating circuit as recited in claim 3 wherein said current source means further includes a fourth transistor of said second conductivity type having a fourth base coupled to said third base, a fourth collector coupled to said third base, and a fourth emitter.

5. A logic gating circuit as recited in claim 2 and further comprising:

a first source of potential;

a second source of potential;

an output terminal; and wherein said first switching means includes, a fourth transistor having a fourth base for receiving current in response to said first switching signal, a fourth collector coupled to said first source of potential and a fourth emitter coupled to said output terminal, and a Schottky diode coupling said fourth base to said fourth collector.

6. A logic gating circuit as recited in claim 5 wherein said second switching means includes, a fifth transistor having a fifth base for receiving said second switching signal, a fifth collector coupled to said output terminal, and a fifth emitter coupled to said second source of potential, and a fourth Schottky diode coupling said fifth base to said fifth collector.

7. A logic gating circuit, comprising:

a first source of potential;

a second source of potential;

an input terminal;

an output terminal;

a first transistor of a first conductivity type having a first base, a first emitter coupled to said first source of potential, and a first collector coupled to said first base;

a second transistor of said first conductivity type having a second base coupled to said first collector, a second emitter coupled to said first source of potential, and a pair of collectors;

a third Schottky-clamped transistor of a second conductivity type having a third base coupled to one of said pair of collectors, a third emitter coupled to said input terminal, and a third collector;

a fourth Schottky-clamped transistor of said second conductivity type having a fourth base coupled to said third collector, a fourth emitter, and a fourth collector coupled to the other of said pair of said collectors;

a fifth transistor having a fifth base coupled to said fourth collector, a fifth collector coupled to said first source of potential, and a fifth emitter;

a sixth Schottky-clamped transistor of said second conductivity type having a sixth base coupled to said fifth emitter, a sixth collector coupled to said first source of potential, and a sixth emitter coupled to said output terminal; and a seventh Schottky-clamped transistor of said second conductivity type having a seventh base coupled to said fourth emitter, a seventh collector coupled to said output terminal; and a seventh emitter coupled to said second source of potential.

8. A logic gating circuit as recited in claim 7 and further comprising a resistor coupling said first collector to said second source of potential.

9. A logic gating circuit as recited in claim 7 and further comprising a diode coupling said sixth collector to said first source of potential.

10. A logic gating circuit as recited in claim 7 wherein said Schottky-clamped transistors each include a Schottky diode coupling the base of the transistor to the collector of the transistor.

* * * * *